US 6,716,696 B2

(12) United States Patent
Chen et al.

(10) Patent No.: US 6,716,696 B2
(45) Date of Patent: Apr. 6, 2004

(54) METHOD OF FORMING A BOTTLE-SHAPED TRENCH IN A SEMICONDUCTOR SUBSTRATE

(75) Inventors: Yi-Nan Chen, Taipei (TW); Hsien-Wen Liu, Tainan (TW)

(73) Assignee: Nanya Technology Corporation, Taoyuan (TW)

( * ) Notice: Subject to any disclaimer, the term of this patent is extended or adjusted under 35 U.S.C. 154(b) by 18 days.

(21) Appl. No.: 10/206,733

(22) Filed: Jul. 26, 2002

(65) Prior Publication Data
US 2003/0143855 A1 Jul. 31, 2003

(30) Foreign Application Priority Data
Jan. 28, 2002 (TW) ........................................ 91101347 A

(51) Int. Cl.⁷ ............................................ H01L 21/8242
(52) U.S. Cl. .................... 438/243; 438/239; 438/386; 438/387; 438/270; 438/268; 438/259
(58) Field of Search ................... 438/239, 243, 438/386, 387, 270, 268, 259

(56) References Cited

U.S. PATENT DOCUMENTS

| 5,112,771 | A | | 5/1992 | Ishii et al. |
|---|---|---|---|---|
| 5,348,905 | A | | 9/1994 | Kenney |
| 5,930,107 | A | * | 7/1999 | Rajeevakumar |
| 6,008,103 | A | * | 12/1999 | Hoepfner |
| 6,018,174 | A | * | 1/2000 | Schrems et al. |
| 6,153,474 | A | * | 11/2000 | Ho et al. |
| 6,190,988 | B1 | * | 2/2001 | Furukawa et al. |
| 6,200,873 | B1 | * | 3/2001 | Schrems et al. |
| 6,232,171 | B1 | * | 5/2001 | Mei |
| 6,271,079 | B1 | * | 8/2001 | Wei et al. |
| 6,359,300 | B1 | * | 3/2002 | Economikos et al. |
| 6,365,485 | B1 | * | 4/2002 | Shiao et al. |
| 6,403,412 | B1 | * | 6/2002 | Economikos et al. |
| 6,426,254 | B2 | * | 7/2002 | Kudelka et al. |
| 6,440,792 | B1 | * | 8/2002 | Shiao et al. |
| 6,451,662 | B1 | * | 9/2002 | Chudzik et al. |
| 6,495,411 | B1 | * | 12/2002 | Mei |
| 6,509,599 | B1 | * | 1/2003 | Wurster et al. |

* cited by examiner

*Primary Examiner*—Long Pham

(57) ABSTRACT

A method of forming a bottle-shaped trench in a semiconductor substrate. First, the semiconductor substrate is selectively etched to form a trench, wherein the trench has a top portion and a bottom portion. An oxide film is then formed on the top portion of the trench. Next, the semiconductor substrate is etched through the bottom portion of the trench with a diluted ammonia solution as the etchant to form a bottle-shaped trench followed by removal of the oxide film.

10 Claims, 5 Drawing Sheets

METHOD OF FORMING A BOTTLE-SHAPED TRENCH IN A SEMICONDUCTOR SUBSTRATE

BACKGROUND OF THE INVENTION

1. Field of the Invention

The present invention relates to the manufacture of semiconductor device, more particularly to a method of forming a bottle-shaped trench in a semiconductor substrate for formation of a capacitor for dynamic recess random memory (DRAM).

2. Description of the Related Art

As the integration density of a dynamic random access memory (DRAM) steadily increases, it becomes necessary to reduce the memory cell size. The memory cell size is primarily determined by the minimum resolution dimension of a lithographic technique, the overlay tolerances between the different features and the layout of these features. At the same time, it is necessary to maintain the minimum required storage capacitance to reliably operate the DRAM. To meet both the cell size requirement and the storage capacitance requirement, a trench capacitor was invented; the simple single device/capacitor memory cell has been altered to provide the capacitor in a vertical dimension. In such designs, the capacitor is formed in a trench in the surface of the semiconductor substrate. For example, U.S. Pat. No. 5,348,905 issued to Kenney on Sep. 20, 1994, entitled, "METHOD OF MAKING DIFFUSED BURIED PLATE TRENCH DRAM CELL ARRAY", teaches the basic elements and process steps for fabricating a buried plate DRAM cell structure.

However, as the size of a DRAM is scaled down by a factor of f (feature size), the trench storage node capacitance decreases by a factor of f. Therefore, it is important to develop methods to increase the storage capacitance. One method employed to increase capacitance is to widen the bottom portion of the trench, thus, increasing the surface area and creating a "bottle shaped" capacitor. However, in order to space the capacitors close together, control of the etching process used to widen the bottom portion becomes a governing factor. Chemical dry etching is predominantly used in the prior art for creating the bottle-shaped portion of the capacitor. In U.S. Pat. No. 5,112,771 issued to Ishii, et al. on May 12, 1992, entitled, "METHOD OF FABRICATING A SEMICONDUCTOR DEVICE HAVING A TRENCH", the bottom region of a trench capacitor is enlarged. This is accomplished by leaving a silicon oxide film on the upper sidewall of a trench, and enlarging the width of the exposed bottom portion of the trench by an isotropic dry etching process. Since the silicon substrate is isotropically dry etched, it is etched not only in the vertical direction to the surface of the substrate, but also in the horizontal direction. Although the capacitor surface area is enlarged, the etching processes are not easily controlled.

SUMMARY OF THE INVENTION

In view of the above disadvantages, an object of the invention is to provide a method of forming a bottle-shaped trench in a semiconductor substrate. According to the method, the capacitor surface area can be efficiently enlarged by a simpler way. That is to say, the formation condition of the bottle-shaped trench for capacitor can be easily controlled.

Accordingly, the above objects of are attained by providing a method of forming a bottle-shaped trench in a semiconductor substrate. First, a hard mask having an opening is formed on the semiconductor substrate. The semiconductor substrate is then etched through the opening of the hard mask to create a trench, by, for example, reactive ion etching, wherein the trench has a top portion and a bottom portion. Next, a nitride film is formed on the surfaces of the trench and the hard mask. Then, a shield material fills the bottom portion of the trench followed by removal a part of the nitride film to leave the nitride film protected by the shield material and expose the surface of the semiconductor substrate at the top portion of the trench. Next, the shield material is removed to expose the nitride film formed on the bottom portion of the trench. Afterward, an oxide film is formed on the top portion of the trench. Then, the nitride film is etched to expose the surface of the semiconductor substrate at the bottom portion of the trench. The semiconductor substrate is selectively etched through the bottom portion of the trench with a diluted ammonia solution as the etchant to form a bottle-shaped trench followed by removal of the oxide film. According to the method of the invention, the bottle shaped trench can be easily created by wet etch through the bottom of the trench. The end point of the wet etch can be easily determined by time mode.

Furthermore, the semiconductor substrate can be single-crystalline silicon substrate. Also, the hard mask preferably comprises a pad oxide formed on the semiconductor substrate and a silicon nitride formed on the pad oxide. The shield material can be formed by coating a photoresist material into the trench followed by partially removing the photoresist material formed at the top portion of the trench to leave the photoresist material formed at the bottom portion of the trench to serve as the shield material.

Furthermore, the nitride film is preferably silicon nitride formed by chemical vapor deposition using a silicon-containing gas and a nitrogen-containing gas as the reactive gas. The silicon-containing gas can be silane, dichlorosilane, or trichlorosilane, the nitrogen-containing gas can be ammonia or nitrogen gas.

Moreover, the oxide film is preferably silicon nitride formed by reaction of the silicon substrate in a high temperature ambient (650° C.~800° C.) containing oxygen and/or water.

Furthermore, the nitride film at the top portion of the trench can be removed by diluted phosphoric acid.

Furthermore, the above objects of the invention can be attained by providing a method of forming a bottle-shaped trench for capacitor in a semiconductor substrate. First, the semiconductor substrate is selectively etched to form a trench, wherein the trench has a top portion and a bottom portion. An oxide film is then formed on the top portion of the trench. Next, the semiconductor substrate is etched through the bottom portion of the trench by a diluted solution to form a bottle-shaped trench followed by removal of the oxide film.

DETAILED DESCRIPTION OF THE INVENTION

The following description explains the method of forming a bottle-shaped trench in a semiconductor substrate according to the preferred embodiments of the invention, which proceeds with reference to the accompanying drawings.

FIGS. 1 to 9 are cross-sections showing the manufacturing steps of forming a bottled-shaped trench in a semiconductor substrate according to the preferred embodiment of the invention.

Figure 1:
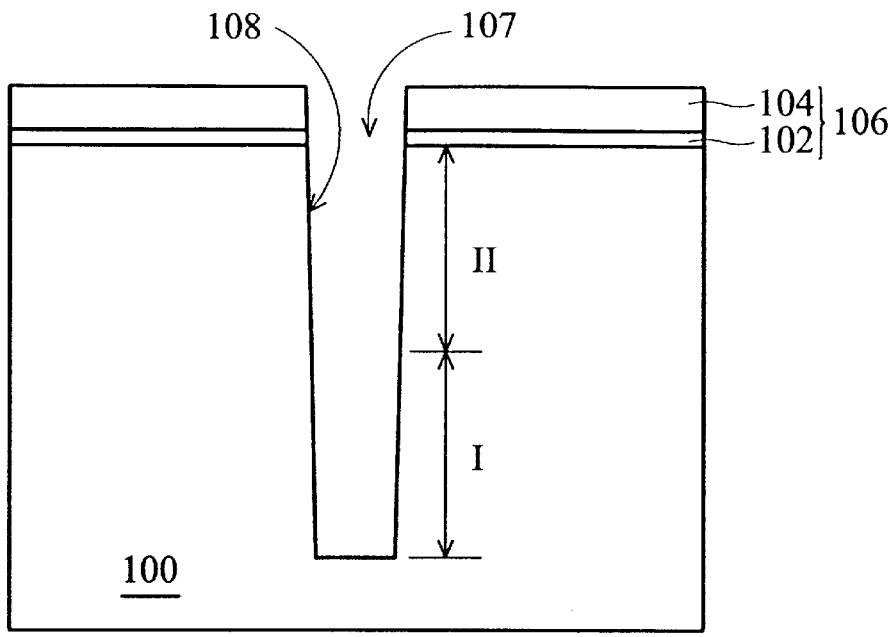
FIGS. 1 to 9 are cross-sections showing the manufacturing steps of forming a bottled-shaped trench in a semiconductor substrate according to the preferred embodiment of the invention.

As shown in FIG. 1, a semiconductor substrate 100 made of single-crystalline silicon is provided. Next, a hard mask 106 having an opening 107 is formed on the predetermined position of the semiconductor substrate 100. The hard mask 106 comprises a pad oxide 102 formed on the surface of the semiconductor substrate 100 and a silicon nitride layer 104. The semiconductor substrate 100 is anisotropically etched through the opening 107 of the hard mask 106 by reactive ion etching using hydrogen bromide (HBr), nitrogen trifluoride ($NF_3$), and oxygen gas ($O_2$) as the main reactive gas. Therefore, A straight trench 108, approximately 60000 to 80000 angstroms depth, is created. The trench 108 is divided into a bottom portion I and a top portion II.

Figure 2:
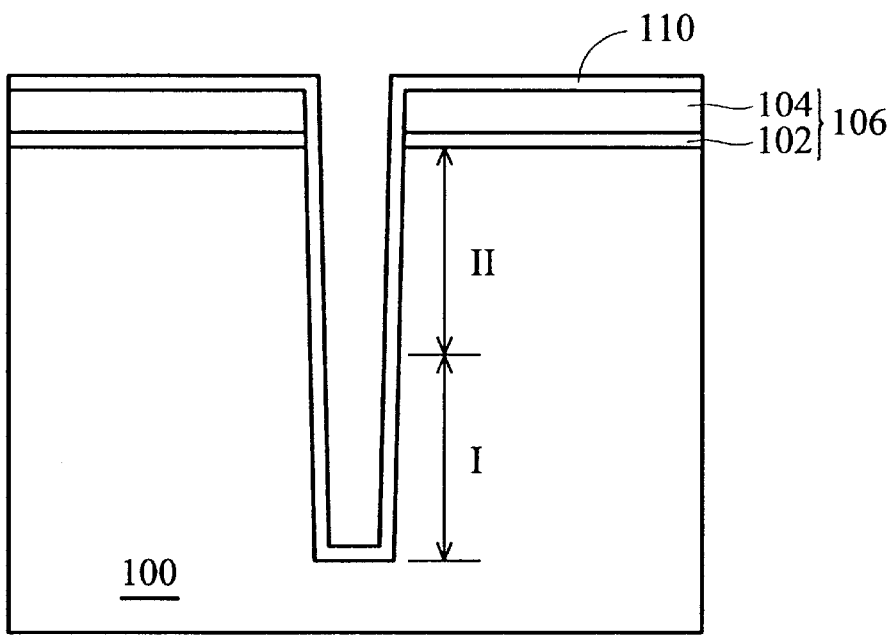

Next, as shown in FIG. 2, a silicon nitride film 110, approximately 15 to 30 angstroms thick, is formed on the surface of the trench 108 and extended onto the upper surface of the hard mask 106 by chemical vapor deposition (CVD) using dichlorosilane and nitrogen gas or dichlorosilane and ammonia gas as the reactive gas.

Figure 3:
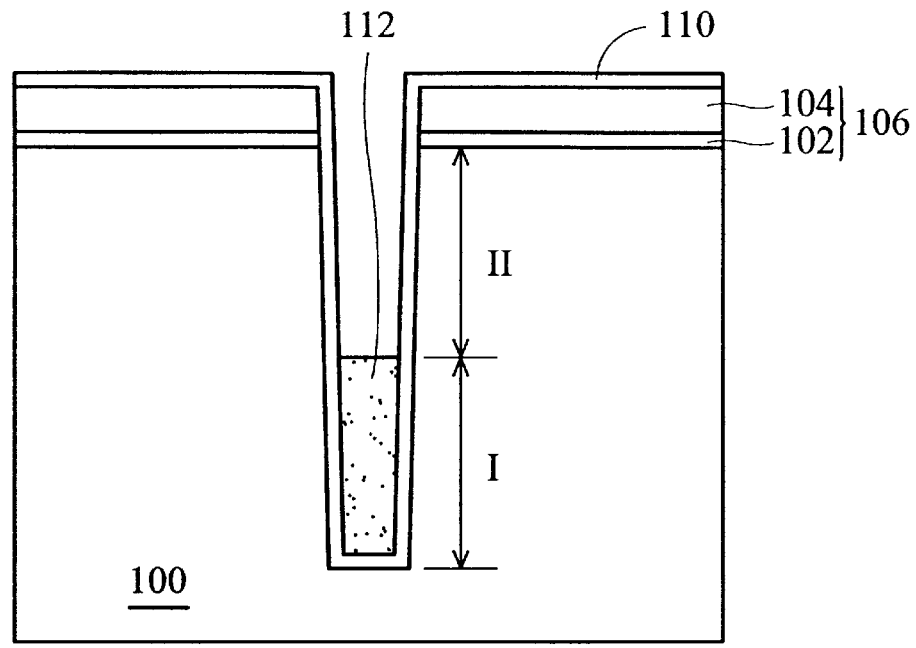

Afterward, referring to FIG. 3, a photoresist material is coated to fill the trench 108 by spin coating. The photoresist material formed at the top portion II is then etched so that a photoresist feature formed at the bottom portion I, serving as the shield material 112, is left. Also, the surface of silicon nitride film 110 at the top portion II is exposed.

Figure 4:
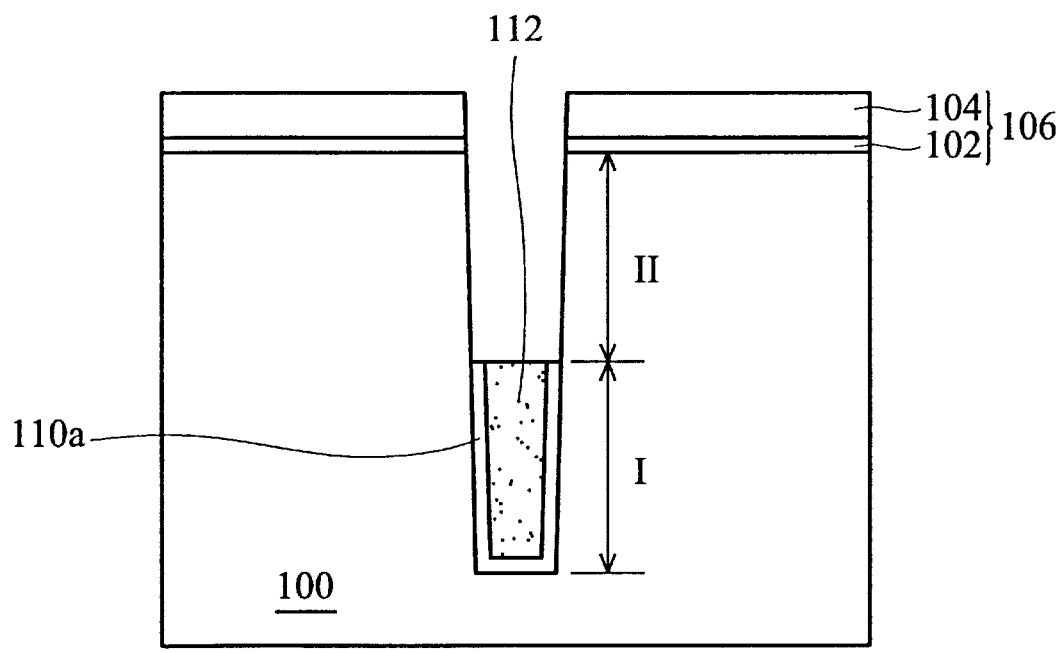
Figure 5:
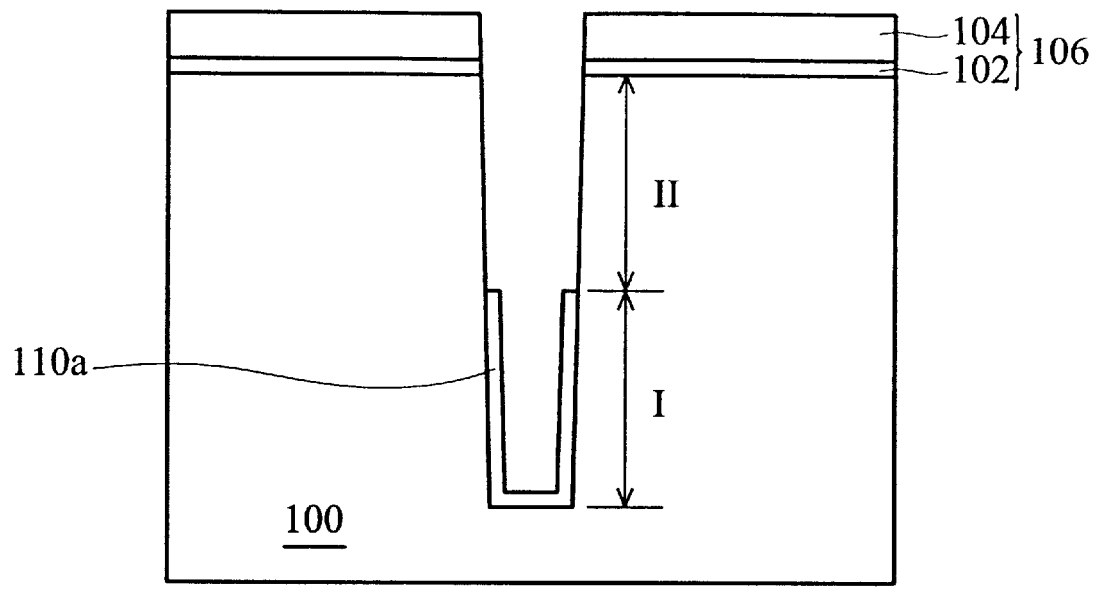

Then, as shown in FIG. 4, the exposed silicon nitride film 110 is wet etched by diluted phosphoric acid to leave a silicon nitride film 110a protected by the shield material 112 and expose the surface of the semiconductor substrate 100 at the top portion II. As shown in FIG. 5, the shield material 112 is completely removed.

Figure 6:
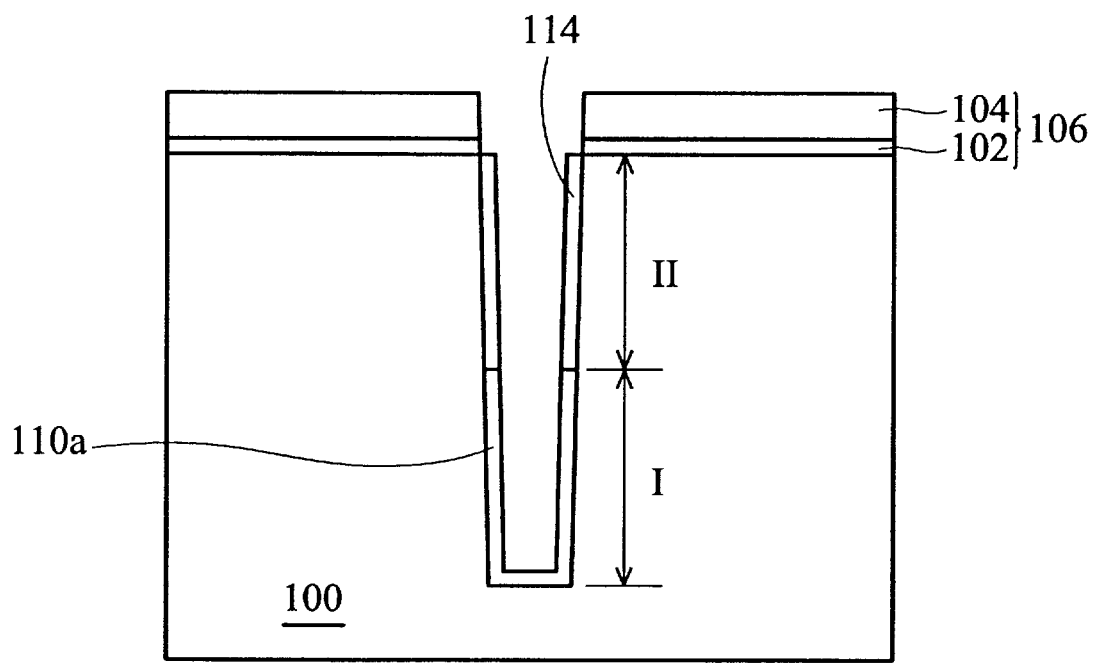

Referring to FIG. 6, a silicon oxide film 114, approximately 50 to 200 angstroms thick, is formed by reaction of exposed semiconductor substrate 100 at the top portion II in a high temperature ambient containing oxygen and/or water. That is to say, the silicon oxide film 114 is formed by rapid thermal oxidation (RTO). Also, the reactive temperature of RTN is about 650° C. to 800° C.

Figure 7:
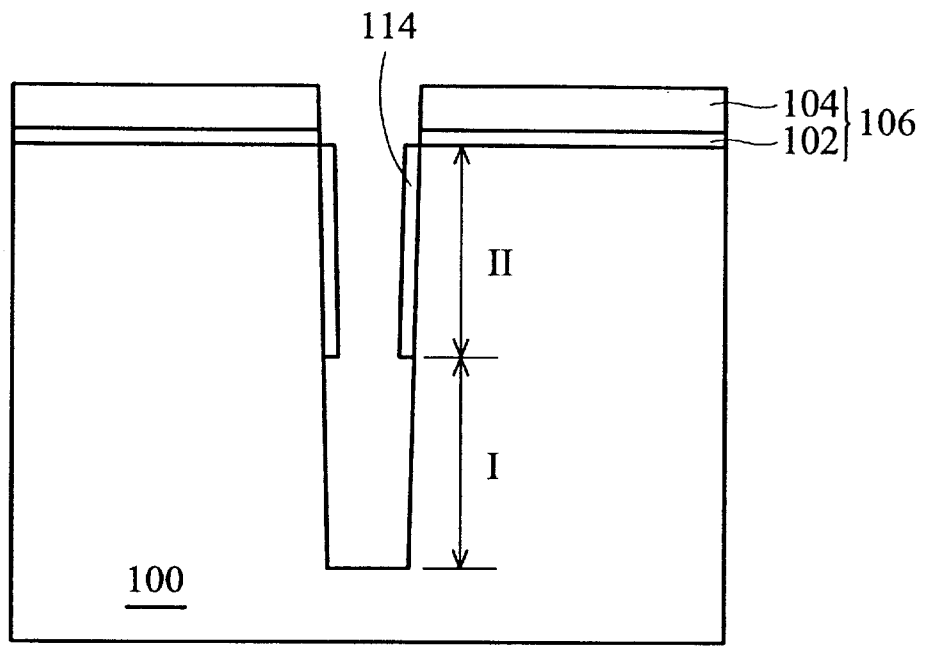
Figure 8:
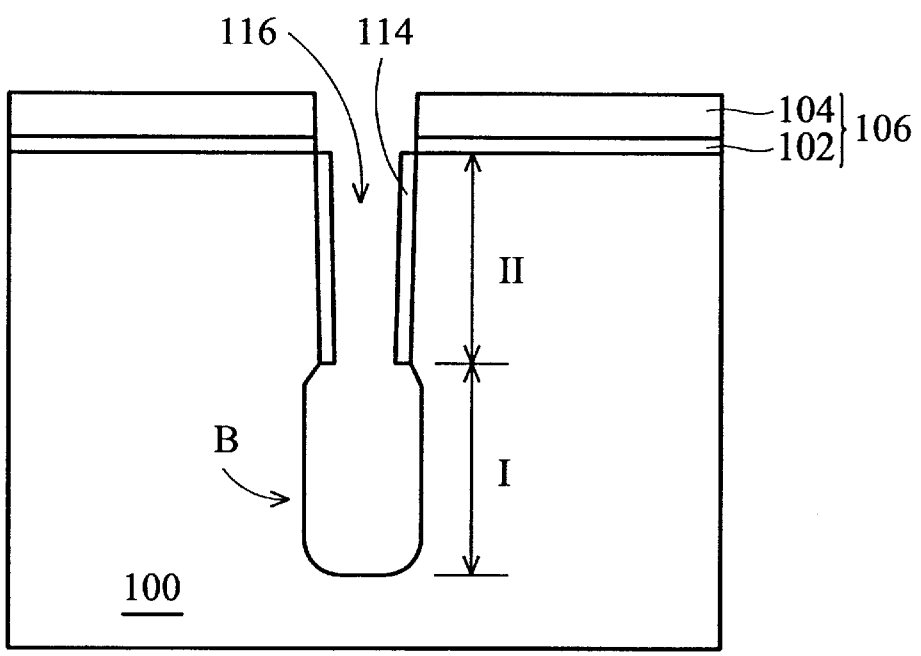

As shown in FIGS. 7 and 8, the remaining silicon nitride film 110a is removed by diluted phosphoric acid until the semiconductor substrate 100 at the bottom portion is exposed. Next, the semiconductor substrate 100 is etched through the bottom portion I of the trench 108 to form a bottle-shaped trench 116 having an enlarged portion B. This etching process is carried out with a diluted ammonia solution. Moreover, the ratio of concentrated ammonia water: water is preferably 1:5~1:50.

Figure 9:
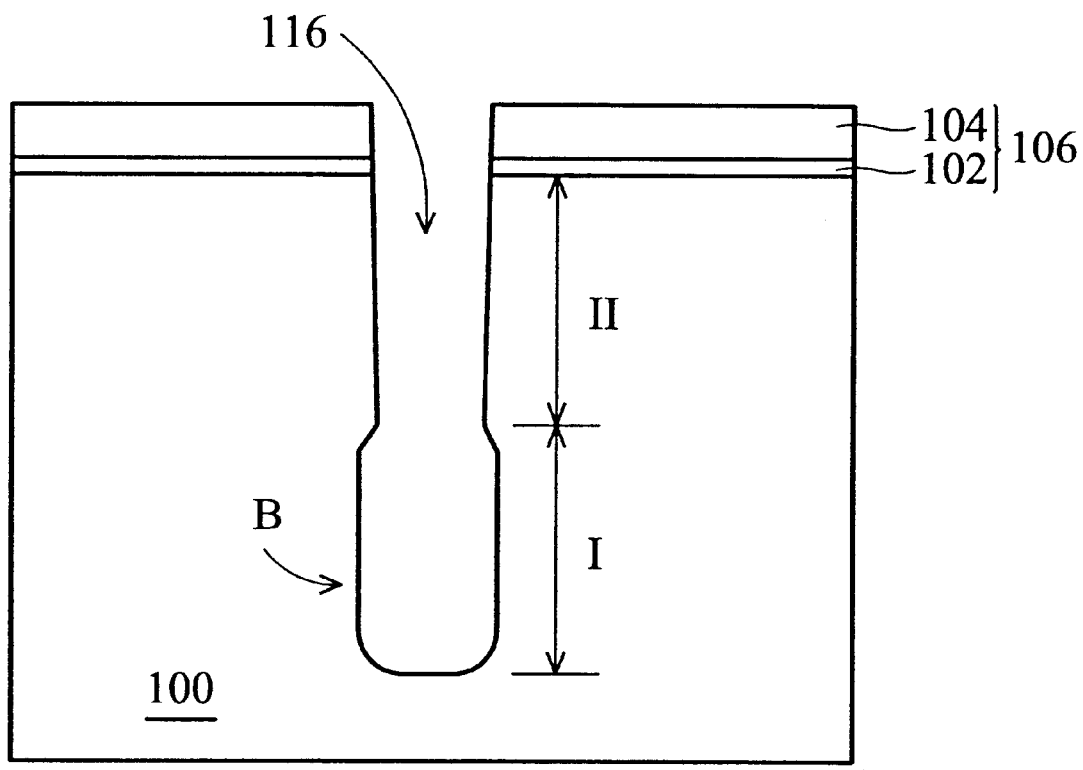

Next, as shown in FIG. 9, silicon oxide film 114 formed on the bottle-shaped trench 116 is removed by hydrofluoric acid or buffered oxide etchant (BOE).

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. A method of forming a bottle-shaped trench in a semiconductor substrate, suitable for formation of a capacitor for DRAM, comprising the steps of:

(a) forming a hard mask having an opening on the semiconductor substrate;

(b) etching the semiconductor substrate through the opening of the hard mask to create a trench, wherein the trench has a top portion and a bottom portion;

(c) forming a nitride film on the surfaces of the trench and the hard mask;

(d) filling a shield material in the bottom portion of the trench;

(e) removing a part of the nitride film to leave the nitride film protected by the shield material and expose the surface of the semiconductor substrate at the top portion of the trench;

(f) removing the shield material to expose the nitride film formed on the bottom portion of the trench;

(g) forming an oxide film on the top portion of the trench;

(h) removing the nitride film to expose the surface of the semiconductor substrate at the bottom portion of the trench;

(i) etching the semiconductor substrate through the bottom portion of the trench with a diluted ammonia solution as the etchant to form a bottle-shaped trench; and (j) removing the oxide film.

2. The method of forming a bottle-shaped trench in a semiconductor substrate as claimed in claim 1, wherein the semiconductor substrate is silicon substrate.

3. The method of forming a bottle-shaped trench in a semiconductor substrate as claimed in claim 1, wherein the hard mask comprises a pad oxide formed on the semiconductor substrate and a silicon nitride formed on the pad oxide.

4. The method of forming a bottle-shaped trench in a semiconductor substrate as claimed in claim 1, wherein step (b) is preformed by anisotropic reactive ion etching (RIE).

5. The method of forming a bottle-shaped trench in a semiconductor substrate as claimed in claim 1, wherein the nitride film is silicon nitride formed by chemical vapor deposition using a silicon-containing gas and a nitrogen-containing gas as the reactive gas.

6. The method of forming a bottle-shaped trench in a semiconductor substrate as claimed in claim 5, wherein the silicon-containing gas is silane, dichlorosilane, or trichlorosilane, the nitrogen-containing gas is ammonia or nitrogen gas.

7. The method of forming a bottle-shaped trench in a semiconductor substrate as claimed in claim 1, wherein step (d) further comprises the steps of:

coating a photoresist material into the trench; and partially removing the photoresist material formed at the top portion of the trench to leave the photoresist material formed at the bottom portion of the trench to serve as the shield material.

8. The method of forming a bottle-shaped trench in a semiconductor substrate as claimed in claim 1, wherein step (e) is preformed by a phosphoric acid solution.

9. The method of forming a bottle-shaped trench in a semiconductor substrate as claimed in claim 2, wherein the oxide film is silicon oxide formed by reaction of the semiconductor substrate in a high temperature ambient containing oxygen and/or water.

10. The method of forming a bottle-shaped trench in a semiconductor substrate as claimed in claim 1, wherein the diluted ammonia solution has a mix ratio of 1:5~1:50 diluted by water.

* * * * *